United States Patent [19]

Yoshida et al.

[11] Patent Number: 5,603,793
[45] Date of Patent: Feb. 18, 1997

[54] METHOD OF FABRICATING CERAMIC GREEN SHEETS WITH SUPPORTING FILMS

[75] Inventors: Kazuhiro Yoshida; Hiromasa Fujii; Mitsugu Suyama, all of Nagaokakyo, Japan

[73] Assignee: Murata Manufacturing Co., Ltd., Japan

[21] Appl. No.: 362,123

[22] Filed: Dec. 22, 1994

[30] Foreign Application Priority Data

Dec. 27, 1993 [JP] Japan ................... 5-332371

[51] Int. Cl.⁶ ............... B32B 31/08; B32B 31/12
[52] U.S. Cl. ............. 156/247; 156/184; 156/192; 156/246; 156/324; 427/209; 427/430.1
[58] Field of Search .................. 156/247, 189, 156/192, 277, 89, 270, 306.3; 427/209, 430.1

[56] References Cited

U.S. PATENT DOCUMENTS

| | | | |
|---|---|---|---|
| 4,076,865 | 2/1978 | Wallsten | 427/209 |
| 4,990,080 | 2/1991 | Kakimoto | 156/89 X |
| 5,019,200 | 5/1991 | Kawabata et al. | 156/270 X |
| 5,051,219 | 9/1991 | Miller. | |
| 5,316,602 | 5/1994 | Kogame et al. | 156/277 X |

FOREIGN PATENT DOCUMENTS

| | | |
|---|---|---|
| 0654345 | 5/1995 | European Pat. Off.. |
| 5-8345 | 1/1993 | Japan. |

*Primary Examiner*—David A. Simmons
*Assistant Examiner*—M. Curtis Mayes
*Attorney, Agent, or Firm*—Ostrolenk, Faber, Gerb & Soffen, LLP

[57] ABSTRACT

A method of fabricating ceramic green sheets with supporting films, in which first and second supporting films 13 and 14 are respectively affixed to both surfaces of a pressure sensitive adhesive double coated tape 12 to construct a supporting member 11, first and second ceramic green sheets 20 and 21 are respectively formed on both surfaces of the supporting member 11, and the first ceramic green sheet 20, along with the first supporting film 13, is stripped from the adhesive tape 12, thereby to obtain the ceramic green sheets 20 and 21 respectively supported by the supporting films 13 and 14.

12 Claims, 3 Drawing Sheets

METHOD OF FABRICATING CERAMIC GREEN SHEETS WITH SUPPORTING FILMS

BACKGROUND OF THE INVENTION

The present invention relates generally to a method of fabricating ceramic green sheets used in a method of fabricating ceramic electronic components, for example, and more particularly, to a method of fabricating ceramic green sheets supported by supporting films composed of synthetic resin or the like.

DESCRIPTION OF THE PRIOR ART

Referring to FIGS. 1A and 1B, one example of a conventional method of fabricating ceramic green sheets will be described.

As shown in FIG. 1A, a supporting film 2 composed of polyethylene terephthalate, polypropylene or the like is first fed from a roll 1. The supporting film 2 is then dipped in a ceramic slurry 4 in a tank 3. The supporting film 2 is further pulled up from the ceramic slurry 4 to make the ceramic slurry 4 adhere to both surfaces of the supporting film 2, followed by drying, thereby to form ceramic green sheets 5 and 6 on both the surfaces of the supporting film 2.

In this method, the ceramic green sheets 5 and 6 are stripped from the supporting film 2 after being formed on both the surfaces of the supporting film 2, as shown in FIG. 1B. Specifically, the ceramic green sheets 5 and 6 are stripped from the supporting film 2 between rollers 7 and 8. Consequently, the ceramic green sheets 5 and 6 are fed to the subsequent steps such as printing of inner electrodes and cutting of the ceramic green sheets.

In recent years, further miniaturization has been required in ceramic electronic components such as multilayer capacitors, and larger capacity multilayer capacitors have been required. Consequently, thin ceramic green sheets have been required. Since the thin ceramic green sheets are low in mechanical strength, attention must be given to the treatment, whereby the ceramic green sheets may not, in some cases, be easily treated unless they are supported by a supporting film.

In the fabricating method shown in FIGS. 1A and 1B, therefore, each of the ceramic green sheets 5 and 6 is prepared in a state where it is not supported by the supporting film, which makes it difficult to cope with thinning of the ceramic green sheets.

On the other hand, as a method to increase the fabrication efficiency of the multilayer capacitor, there has been proposed a method of forming ceramic green sheets on a supporting film using a roll coater, conveying the ceramic green sheets in a state where they are supported by the supporting film, and then carrying out the steps such as drying and printing of inner electrodes. Such a method makes it possible to cope with even a case where the thickness of the ceramic green sheets is decreased.

However, when a ceramic slurry uses water as a solvent, that is, a water soluble binder is used as a binder contained in the ceramic slurry and water or an aqueous solution is used as a solvent, for example, the above described fabricating method cannot be, in some cases, employed. The reason for this is that this type of aqueous slurry is generally low in viscosity, thereby to make it difficult to form the ceramic green sheets using the roll coater.

If the ceramic green sheets are obtained using the above described aqueous slurry, therefore, the method of fabricating ceramic green sheets shown in FIG. 1A is forced to be used, whereby the ceramic green sheets are difficult to treat and cannot be thinned.

SUMMARY OF THE INVENTION

An object of the present invention is to provide a method of fabricating ceramic green sheets with supporting films, which makes it easy to cope with thinning of ceramic green sheets and makes it possible to efficiently obtain ceramic green sheets backed by supporting films even when the ceramic green sheets are obtained using an aqueous slurry.

The present invention provides a method of fabricating ceramic green sheets with supporting films which is characterized by comprising the steps of preparing a supporting member constructed by affixing supporting films to both surfaces of a longitudinal adhesive layer at least both surfaces of which have adhesive properties, forming ceramic green sheets on both surfaces of the supporting member, and stripping the ceramic green sheet supported by one of the supporting films, along with the supporting film, from the adhesive layer, thereby to obtain a pair of ceramic green sheets supported by the supporting films.

In the fabricating method according to the present invention, the ceramic green sheets are formed on the supporting films positioned on both the surfaces of the adhesive layer. Specifically, the pair of ceramic green sheets supported by the supporting films is prepared. One of the ceramic green sheets supported by the supporting films, along with the supporting film, is stripped from the adhesive layer, to be separated from the ceramic green sheet supported by the other supporting film.

Therefore, it is possible to efficiently obtain the ceramic green sheets supported by the supporting films by dipping the supporting member in a tank storing a ceramic slurry as in the fabricating method shown in FIG. 1A, for example. Specifically, it is possible to efficiently obtain the ceramic green sheets supported by the supporting films irrespective of the type of ceramic slurry used and the type of method of forming ceramic green sheets.

Therefore, the ceramic green sheets can be fabricated using the fabricating method shown in FIG. 1A, for example, and the ceramic green sheets can be subsequently fed in a state where they are supported by the supporting films to the steps such as printing of inner electrode materials, thereby to make it possible to also simplify the fabricating method of ceramic multilayer electronic components.

Additionally, the ceramic green sheets are fed in a state where they are supported by the supporting films, which makes it possible to easily cope with thinning of the ceramic green sheets.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 2:
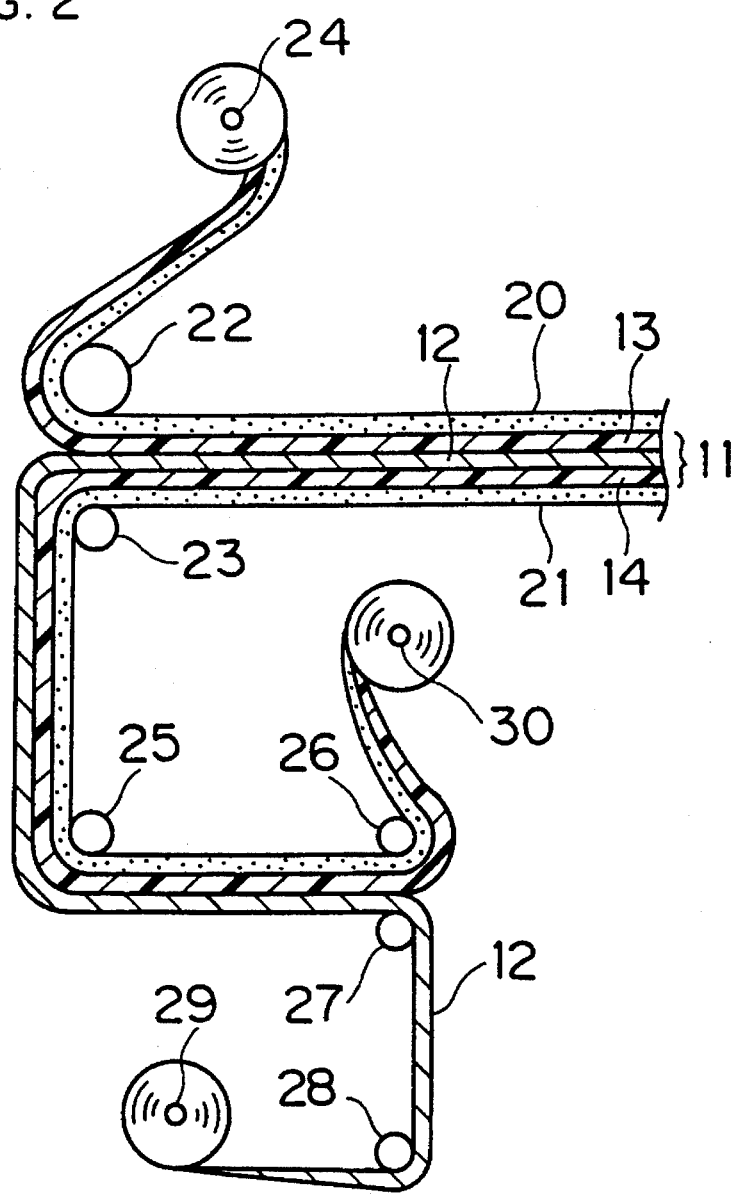
FIG. 2 is a cross sectional view for explaining a method of fabricating ceramic green sheets with supporting films according to one embodiment of the present invention.
Figure 3:
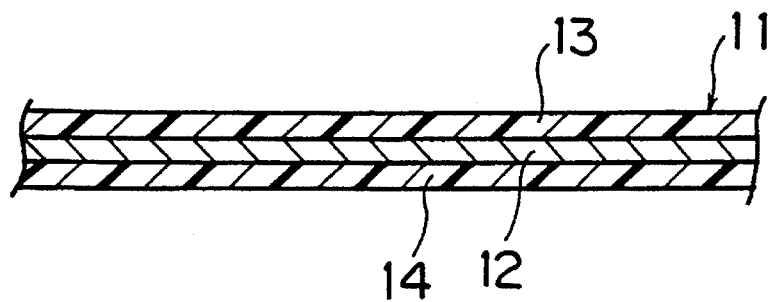
FIG. 3 is a partially cutaway sectional view for explaining a supporting member.

Embodiments will be described with reference to the drawings, to clarify the present invention. FIGS. 2 and 3 are cross sectional views for explaining a method of fabricating ceramic green sheets with supporting films according to one embodiment of the present invention.

In the present embodiment, a supporting member 11 shown in FIG. 3 is first prepared. The supporting member 11 has a structure in which first and second supporting films 13 and 14 are respectively affixed to both surfaces of a pressure sensitive adhesive double coated tape 12. Examples of the adhesive tape 12 include a plastic film composed of polyethylene having a thickness of approximately 5 to 30 μm both surfaces of which are coated with pressure sensitive adhesives. Although the adhesive tape 12 constitutes an adhesive layer according to the present invention, an adhesive layer composed of acrylic series pressure sensitive adhesives which permit repeated cycles in which the supporting films 13 and 14 are bonded thereto and removing therefrom, for example, may be interposed between the supporting films 13 and 14 in place of the adhesive tape 12.

Examples of the above described first and second supporting films 13 and 14 include a synthetic resin film composed of a suitable material which has been conventionally used for supporting ceramic green sheets, for example, a polypropylene film or a polyethylene terephthalate film.

FIG. 3 illustrates only a part of the supporting member 11. The supporting member 11 is in a longitudinal shape having a certain degree of length.

In the present embodiment, ceramic green sheets are formed on both surfaces of the supporting member 11. As a method of forming the ceramic green sheets, an arbitrary method can be employed. For example, as shown in FIG. 4, the supporting member 11 is fed from a roll 15 around which the supporting member 11 is wound, is dipped in a ceramic slurry 16 stored in a tank 17, is pulled up from the ceramic slurry 16 to make the ceramic slurry 16 to adhere to both the surfaces of the supporting member 11 to a predetermined thickness, thereby to make it possible to form ceramic green sheets, as shown in FIG. 4.

Figure 4:
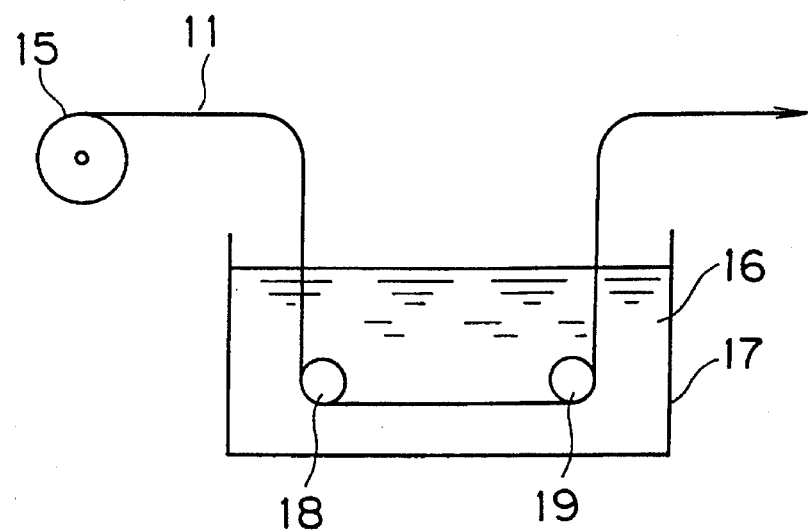
FIG. 4 is a schematic view for explaining one example of a method of forming ceramic green sheets.

In FIG. 4, reference numerals 18 and 19 denote rollers, which are arranged so as to change the direction of the supporting member 11.

Such a method of dipping the supporting member 11 in the ceramic slurry 16 and pulling up the supporting member 11 to form ceramic green sheets can be suitably used in a case where ceramic green sheets are formed using a ceramic slurry relatively low in viscosity, for example, using water as a solvent.

In the above described manner, the first and second ceramic green sheets 20 and 21 are formed on both the surfaces of the supporting member 11, as shown in FIG. 2. The ceramic green sheet 20 supported by the first supporting film 13, along with the first supporting film 13, is stripped from the adhesive tape 12 between rollers for stripping 22 and 23, and is wound around a roll 24.

On the other hand, the second ceramic green sheet 21, along with the adhesive tape 12 and the second supporting film 14, are caused to travel toward a roller 25. Further, the adhesive tape 12 is stripped between rollers for stripping 26 and 27. The traveling direction of the adhesive tape 12 is changed through a roller 28, and is wound around a roll 29. The wound adhesive tape 12 can be used for constructing a supporting member 11 again. Specifically, the adhesive tape 12 is reusable.

On the other hand, the second ceramic green sheet 21 supported by the second supporting film 14 is wound around a roll 30, whereby the second ceramic green sheet 21 supported by the second supporting film 14 is prepared as a wound member, similarly to the first ceramic green sheet 20 supported by the first supporting film 13.

A pair of rolls 24 and 30 around which the ceramic green sheets supported by the supporting films are wound can be obtained in the above described manner, and the ceramic green sheets can be fed from the rolls to the subsequent steps and used for a method of fabricating ceramic electronic components. As a result, it is possible to feed thin ceramic green sheets reliably and stably.

Figure 5:
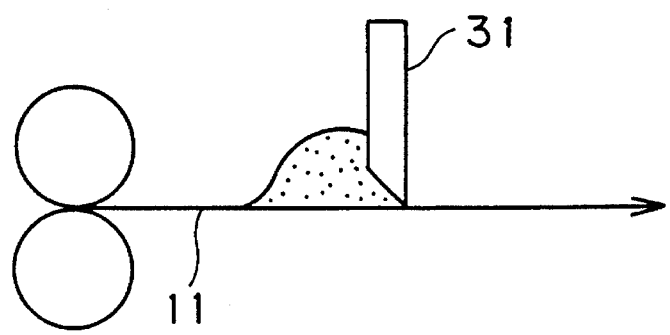
FIG. 5 is a schematic view for explaining another example of a method of forming ceramic green sheets.

In the above described embodiment, as a method of forming ceramic green sheets, a method of dipping the supporting member 11 in the ceramic slurry 16, pulling up the supporting member 11 from the ceramic slurry 16 and drying the same is illustrated. In place of this method, a doctor blade 31 may be used to form a ceramic green sheet on one surface of a supporting member 11 by the Doctor blade process and further form a ceramic green sheet on the other surface thereof by the Doctor blade process, as shown in FIG. 5. Alternatively, a roll coater may be used to form ceramic green sheets on both surfaces of a supporting member 11. In these case, it goes without saying that the ceramic green sheets can be formed on both the surfaces of the supporting member 11 using a ceramic slurry other than an aqueous slurry using water as a solvent.

Figure 6:
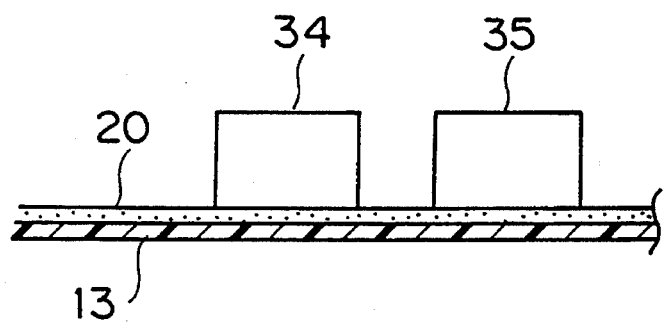
FIG. 6 is a cross sectional view for explaining a method of carrying out the respective steps continuously using ceramic green sheets with supporting films.

Although in the embodiment shown in FIG. 2, the ceramic green sheets supported by the supporting films are finally wound around the rolls 24 and 30, a pair of ceramic green sheets supported by the supporting films need not be necessarily wound around the rolls after being obtained. Specifically, as represented by the first ceramic green sheet 20 supported by the first supporting film 13 in FIG. 6, an inner electrode printer 34, a drier 35 and the like may be further arranged in the succeeding stage of the roller 22 shown in FIG. 2, to carry out the subsequent steps such as printing of inner electrodes and drying of the ceramic green sheet 20 continuously while causing the ceramic green sheet 20 supported by the supporting film 13 to travel with the ceramic green sheet 20 supported by the supporting film 13. Similarly, with respect to the second ceramic green sheet 21 supported by the second supporting film 14, the steps such as printing of inner electrodes and drying can be continuously carried out.

Figure 1A:
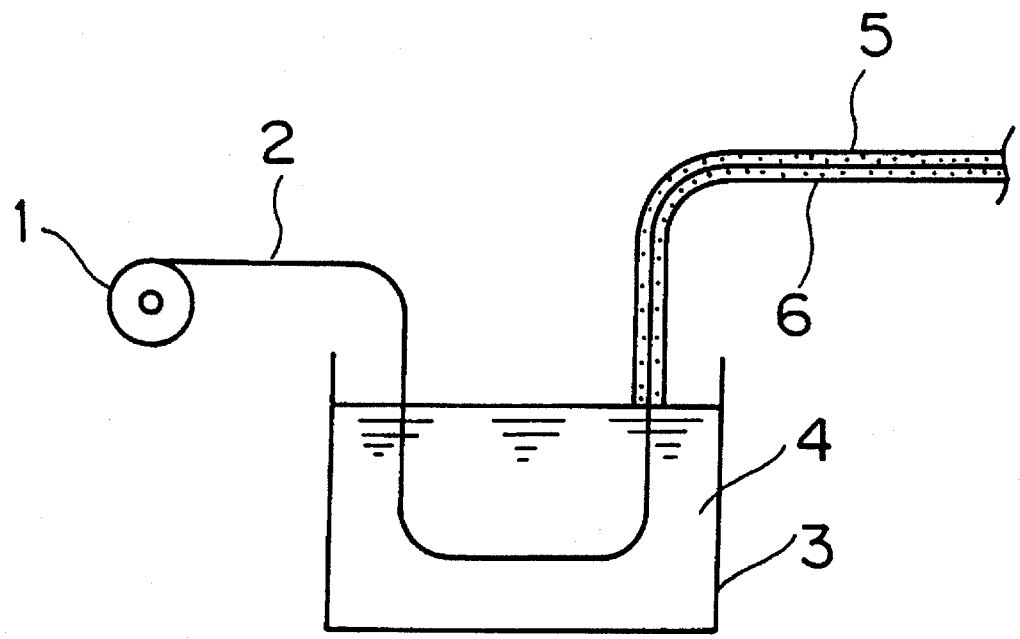
FIGS. 1A and 1B are respectively a schematic view and a cross sectional view for explaining one example of a conventional method of fabricating ceramic green sheets.
Figure 1B:
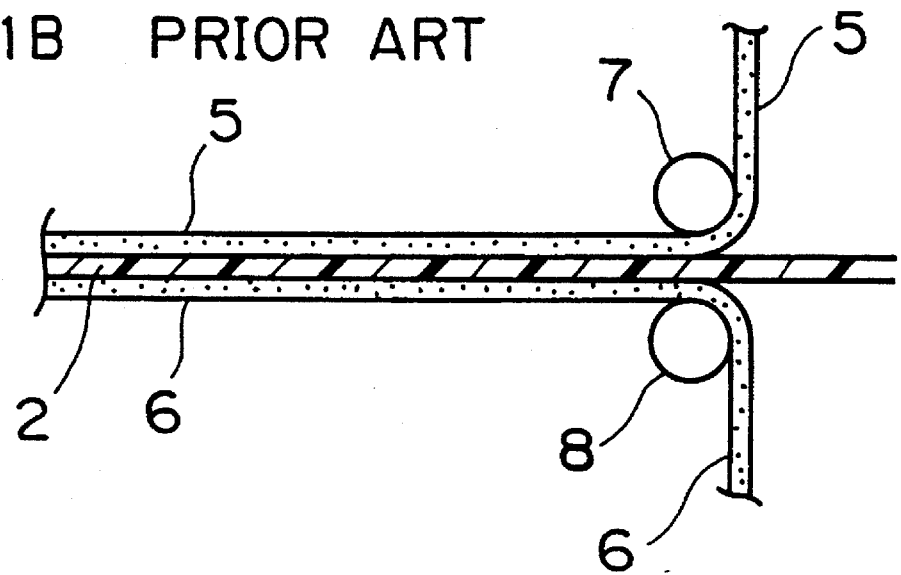

Since in the conventional method shown in FIG. 1, ceramic green sheets alone are prepared without being backed by supporting films, the ceramic green sheet 5 cannot be utilized for a method of continuously fabricating ceramic electronic components. On the other hand, in the method according to the present embodiment, both the first and second ceramic green sheets 20 and 21 can be utilized for the above described method of continuously fabricating ceramic electronic components. Accordingly, it is possible to effectively increase the fabrication efficiency of the ceramic electronic components.

Although in the embodiment shown in FIG. 2, the pressure sensitive adhesive double coated tape 12 constituting an adhesive layer is stripped from the second supporting film 14, the adhesive tape 12 may remain affixed to the second supporting film 14. Similarly, even when an adhesive layer is constructed using pressure sensitive adhesives capable of repeated use in place of the adhesive tape 12, the second ceramic green sheet 21 supported by the second supporting film 14 may be fed to the subsequent steps with the adhesive layer applied to the second supporting film 14.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of fabricating ceramic green sheets with supporting films, comprising the steps of:

preparing a supporting member constructed by affixing supporting films to both surfaces of a longitudinal adhesive tape at least both surfaces of which have adhesive properties;

forming ceramic green sheets on said supporting films on both surfaces of said supporting member; and stripping the ceramic green sheet supported by one of the supporting films, along with said one supporting film, from said adhesive tape, thereby to obtain a separated pair of ceramic green sheets supported by the corresponding supporting films.

2. The method of forming ceramic green sheets with supporting films according to claim 1, wherein said ceramic green sheets are formed on said supporting films on both surfaces of said supporting member by dipping said supporting member in a tank storing a ceramic slurry and pulling the supporting member out of the tank.

3. The method of fabricating ceramic green sheets with supporting films according to claim 1, wherein said ceramic green sheets are formed on said supporting films on both the surfaces of said supporting member using a doctor blade process.

4. The method of fabricating ceramic green sheets with supporting films according to claim 1, wherein the pair of ceramic green sheets with the supporting films is obtained by forming said ceramic green sheets on said support films on both surfaces of said supporting member, and then separating said ceramic green sheet supported by one of said supporting films, said ceramic green sheet supported by the other supporting film, and said adhesive tape in said supporting member from each other.

5. The method of fabricating ceramic green sheets with supporting films according to claim 4, further comprising the step of:

winding in a roll shape said ceramic green sheets with the supporting films from which said adhesive tape is stripped.

6. The method of fabricating ceramic green sheets with supporting films according to claim 4, further comprising the step of:

stripping said ceramic green sheets with the supporting films from said adhesive tape, and then continuously feeding the stripped ceramic green sheets with the supporting films to subsequent processing steps.

7. The method of fabricating ceramic green sheets with supporting films according to claim 2, wherein the pair of ceramic green sheets with the supporting films is obtained by forming said ceramic green sheets on said supporting films on both surfaces of said supporting member, and then separating said ceramic green sheet supported by one of said supporting films, said ceramic green sheet supported by the other supporting film, and said adhesive tape in said supporting member from each other.

8. The method of fabricating ceramic green sheets with supporting films according to claim 3, wherein the pair of ceramic green sheets with the supporting films is obtained by forming said ceramic green sheets on said supporting films on both surfaces of said supporting member, and then separating said ceramic green sheet supported by one of said supporting films, said ceramic green sheet supported by the other supporting film, and said adhesive tape in said supporting member from each other.

9. The method of fabricating ceramic green sheets with supporting films according to claim 7, further comprising the step of:

winding in a roll shape said ceramic green sheets with the supporting films from which said adhesive is stripped.

10. The method of fabricating ceramic green sheets with supporting films according to claim 8, further comprising the step of:

winding in a roll shape said ceramic green sheets with the supporting films from which said adhesive tape is stripped.

11. The method of fabricating ceramic green sheets with supporting films according to claim 7, further comprising the step of:

stripping said ceramic green sheets with the supporting films from said adhesive tape, and then continuously feeding the stripped ceramic green sheets with the supporting films to subsequent processing steps.

12. The method of fabricating ceramic green sheets with supporting films according to claim 8, further comprising the step of:

stripping said ceramic green sheets with the supporting films from said adhesive tape, and then continuously feeding the stripped ceramic green sheets with the supporting films to subsequent processing steps.

* * * * *